United States Patent [19]

Mehrgardt

[11] Patent Number: 5,138,567
[45] Date of Patent: Aug. 11, 1992

[54] MEDIAN FILTER

[73] Assignee: Deutsche ITT Industries Gmfh, Freiburg, Fed. Rep. of Germany

[75] Inventor: Soenke Mehrgardt, March, Fed. Rep. of Germany

[21] Appl. No.: 667,800

[22] Filed: Mar. 11, 1991

[30] Foreign Application Priority Data

Mar. 23, 1990 [EP] European Pat. Off. ........ 90105499.9

[51] Int. Cl.$^5$ .............................................. G06F 15/31
[52] U.S. Cl. .............................................. 364/724.01
[58] Field of Search .................................... 364/724.01

[56] References Cited

U.S. PATENT DOCUMENTS 4,928,258  5/1990  May .............................. 364/724.01

FOREIGN PATENT DOCUMENTS 0257843  3/1988  European Pat. Off. .

OTHER PUBLICATIONS

H0-ming Lin, et al., "Median Filters with Adaptive Length", *IEEE Transactions on Circuits and Systems*, vol. 35, No. 6, Jun. 1988, pp. 675-690.
Petros Maragos, et al., "Morphological Filters–Part I: Their Set-Theoretic Analysis and Relations to Linear Shift-Invariant Filters", *IEEE Transactions on Acoustics, Speech, and Signal Processing*, vol. ASSP-35, No. 8, Aug. 1987, pp. 1153-1169.
Petros Maragos, et al., "Morphological Filters–Part II: Their Relations to Median, Order-Statistic, and Stack Filters", *IEEE Transactions on Acoustics, Speech, and Signal Processing*, vol. ASSP-35, No. 8, Aug. 1987, pp. 1170-1183.
Azriel Rosenfeld, et al., *Digital Picture Processing*, Second Edition, vol. 1, Academic Press, Inc., pp. 261-265.
Helmut Schönfelder, *Digital Filter in der Videotechnik*, ISBN, 3-925786-02-3, 1988, pp. 125, 126,224-226.

*Primary Examiner*—Long T. Nguyen

[57]  ABSTRACT

In a median filter, signals received at the input are fed to a cascade of delay elements whose number is equal to the degree N of the median filter. The signals at the outputs of the delay elements which preceded the signal received at the input are fed to N subtracters which form the differences between the signal at the input and the N preceding signals. The signs of the differences are stored in shift registers, and upon receipt of a new signal at the input, they are shifted by one place. From the signs of the differences, the selection unit determines the median as the signal for which N/2 differences have negative signs and N/2 differences have positive signs.

6 Claims, 4 Drawing Sheets

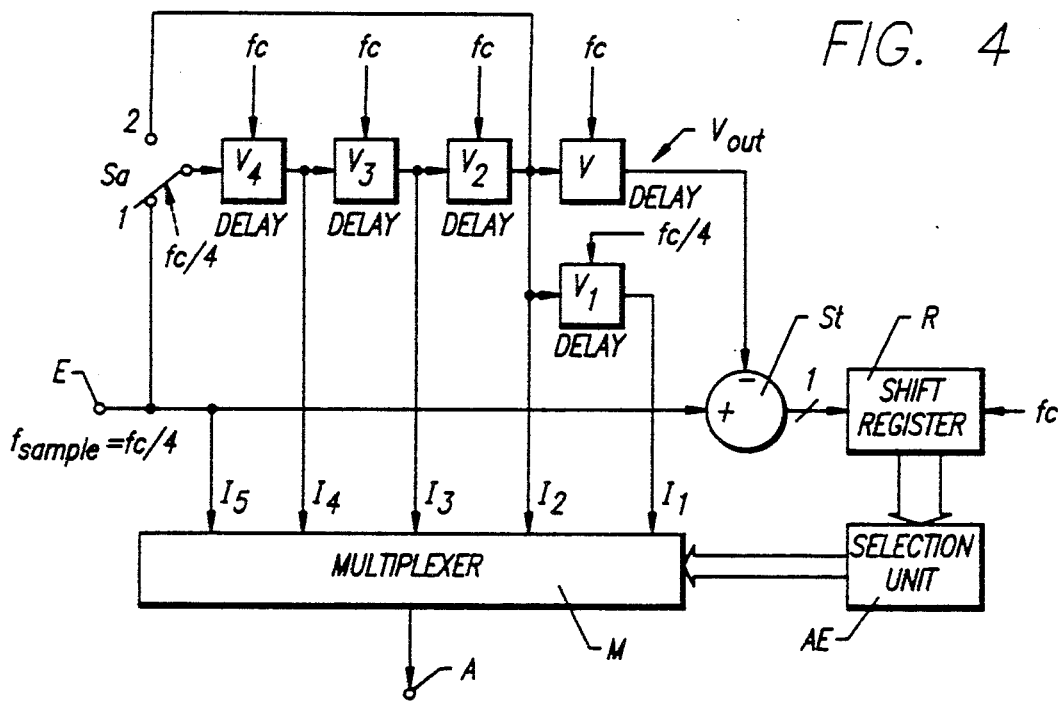

| INPUT E =$I_5$ | $I_4$ | $I_3$ | $I_2$ | $I_1$ | $V_{out}$ | SWITCH Sa | OUTPUT OF ST [= CARRY] |
|---|---|---|---|---|---|---|---|
| $S_1$ | X | X | X | X | X | 1 | X |
| $S_2$ | $S_1$ | X | X | X | X | } 2 | X |
| $S_2$ | X | $S_1$ | X | X | X |  | X |
| $S_2$ | X | X | $S_1$ | X | X |  | X |
| $S_2$ | $S_1$ | X | X | X | $S_1$ | 1 | $S_2-S_1$ |
| $S_3$ | $S_2$ | $S_1$ | X | X | X | } 2 | X |
| $S_3$ | X | $S_2$ | $S_1$ | X | X |  | X |
| $S_3$ | $S_1$ | X | $S_2$ | X | $S_1$ |  | $S_3-S_1$ |
| $S_3$ | $S_2$ | $S_1$ | X | X | $S_2$ | 1 | $S_3-S_2$ |
| $S_4$ | $S_3$ | $S_2$ | $S_1$ | X | X | } 2 | X |
| $S_4$ | $S_1$ | $S_3$ | $S_2$ | X | $S_1$ |  | $S_4-S_1$ |
| $S_4$ | $S_2$ | $S_1$ | $S_3$ | X | $S_2$ |  | $S_4-S_2$ |
| $S_4$ | $S_3$ | $S_2$ | $S_1$ | X | $S_3$ | 1 | $S_4-S_3$ |
| $S_5$ | $S_4$ | $S_3$ | $S_2$ | $S_1$ | $S_1$ | } 2 | $S_5-S_1$ |
| $S_5$ | $S_2$ | $S_4$ | $S_3$ | $S_1$ | $S_2$ |  | $S_5-S_2$ |
| $S_5$ | $S_3$ | $S_2$ | $S_4$ | $S_1$ | $S_3$ |  | $S_5-S_3$ |
| $S_5$ | $S_4$ | $S_3$ | $S_2$ | $S_1$ | $S_4$ | 1 | $S_5-S_4$ |

MEDIAN FILTER

BACKGROUND OF THE INVENTION

1. Field of the Invention

The present invention relates to a median filter by which a signal sequence is replaced by the signal representing the middle value (median) in a signal group which is formed by the signal to be replaced as well as by a plurality of signals occurring before and after the middle value.

2. Description of the Related Art

A median filter replaces a signal sequence by a signal that represents the median value in a signal group that includes a signal to be replaced along with N/2 signals that occur immediately before the signal to be replaced and N/2 signals that occur immediately after the signal to be replaced, where N is an even integer and specifies the degree of the filter. The signals received at the input are fed to a cascade of delay elements whose number is equal to the degree of the median filter, so that upon receipt of a signal at the input, the N preceding signals appear at the outputs of the delay elements. The median of the signal group is determined in a selection unit and is switched to the output of the median filter.

A median filter thus sorts a number of signals in order of amplitude and replaces the current value by the middle value (median) of the sorted signal sequence. Median filters are time-discrete, nonlinear filters. Median filters have repeatedly been proposed for use with television signals (see, for example, P. Maragos and R. W. Schafer, "Morphological Filters-Part II: Their Relations to Median, Order-Statistic, and Stack Filters", *"IEEE TRANSACTIONS ON ACOUSTICS, SPEECH, AND SIGNAL PROCESSING"*, Vol. ASSP-35, No. 8, August 1987, pp. 1170–1183; A. Rosenfeld and A. C. Kak, "Digital Picture Processing", 2nd Ed., Vol. 1, 1982, pp. 261–265; and Helmut Schönfelder, "Digitale Filter in der Videotechnik" (1988), pp. 125, 126, 224–226). Median filters suppress signal changes of short duration (i.e., mainly noise) while transmitting signal-level changes of longer duration, such as step and ramp edges, without distortion.

To determine the median of the signal sequence, each value of a signal group must be compared with every other value of the signal groups, and the results of these comparisons must be processed by logic circuitry. This is very complicated and costly.

It is the object of the invention to provide a simplified circuit for a median filter of the above kind.

SUMMARY OF THE INVENTION

The invention is characterized in that the N signals appearing at the outputs of the delay elements which preceded the signal received at the input are fed to N subtracters which form the differences between the signal at the input and the N preceding signals. The signs of the differences are transferred into shift registers in which they are shifted by one place upon receipt of a new signal at the input, so that the shift registers also hold the signs of the differences at the instants of the N preceding signals as far as they are necessary to determine the median of the signal group in the selection unit. The number of memory locations is determined by the number of signs to be stored. The signs of the differences required to determine the median are transferred from the memory locations of the shift registers into the selection unit. The selection unit is followed by a multiplexer which is fed with the signal received at the input and with the N preceding signals from the outputs of the delay elements. The selection unit determines from the signs of the differences the median as that signal for which N/2 differences have negative signs and N/2 differences have positive signs. The selection unit then provides to the multiplexer a corresponding control signal which switches the median to the output.

A further solution is characterized in that the signals are processed at a system clock frequency which is N times the frequency at which the signals appear at the input of the median filter. Upon receipt of each signal at the input, the input is connected by means of a switch to a cascade of N delay elements for the duration of one system clock period. During the remaining system clock periods, the switch connects the input of the first delay element to the output of the next to the last delay element. The output of the last delay element is constantly connected to the subtrahend input of a subtracter having its minuend input connected to the input of the median filter, such that during the N system clock periods between the receipt of the signals at the input, the subtracter forms the differences between the signal at the input and the N preceding signals. The signs of the differences are stored in a shift register having $N(N+1)/2$ locations and are shifted one place by each system clock pulse. The signs stored in the memory locations of the shift register are transferred to the selection unit. In the selection unit, the median is determined as that signal for which N/2 differences have negative signs and N/2 differences have positive signs. The selection unit is followed by a multiplexer which is fed with the signal received at the input and with the N preceding signals from the outputs of the delay elements. One of the signals is switched to the output in dependence on the determination made in the selection unit.

In preferred embodiments of the median filter, the selection unit is divided into subcircuits. In each subcircuit, a logic network determines for one of the signals of the signal group whether N/2 differences have positive signs and N/2 differences have negative signs. If this condition is satisfied, a line assigned to the signal and running to the multiplexer will be activated.

The present invention thus requires a comparatively small number of subtracters. The invention uses the recognition that part of the subtractions to be performed for each signal of the signal sequence to determine the median were already performed during the preceding signal or have to be performed again when determining the median during the subsequent signal. Using shift registers, the circuit is therefore designed so that these subtractions need not be performed again but can be taken from the previously performed comparisons. The results of the subtractions required to determine the median, or the signs of the results of the comparisons and their temporal assignment, are made available by the shift registers, which follow the subtracters.

BRIEF DESCRIPTION OF THE DRAWINGS

The embodiments of the invention and further advantageous features of the invention will now be described with reference to the accompanying drawings, in which:

FIG. 4 illustrates a secondary embodiment of the invention; and

FIG. 4a is a tabular representation of the temporal succession of the signals in FIG. 4.

DETAILED DESCRIPTION OF THE INVENTION

Figure 1:
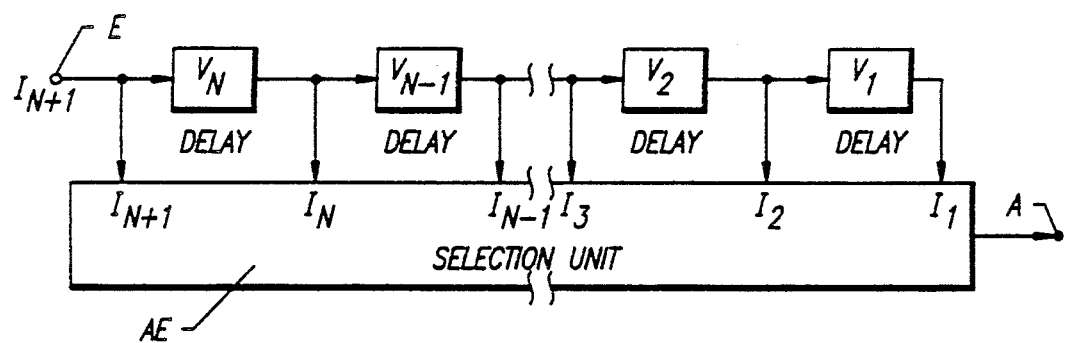
FIG. 1 illustrates a prior art median filter.

FIG. 1 shows the basic structure of a prior art median filter of degree N. The signal $I_{N+1}$ received at the input E passes through a cascade of N delay elements $V_N$, $V_{N-1}, \ldots, V_1$, so that at the time of receipt of $I_{N+1}$, the N preceding signals $I_N, I_{N-1}, \ldots, I_3, I_2, I_1$ are available at the outputs of these delay elements. These signals are fed to a selection unit AE, which determines the "median". This median is the middle value of the signals $I_{N+1}, I_N, \ldots, I_1$ (signal group) if these signals are sorted in order of size (amplitude). That will be the case if N/2 of the other signals have values greater than the median and N/2 have values less than the median. This median is then transferred as an output signal to the output A of the selection unit AE. In the selection unit AE, the values $I_{N+1}, I_N, \ldots, I_1$ must thus be sorted in order of size. The middle value is then switched through as the output signal.

The following examples will explain a median filter of degree 2 (N=2):

(a) First assume a signal sequence at the input of 0, 0, 1, 0, 0. Each value must thus be replaced by the median of its own signal group and of its two neighbors. In the case of the first value ("0"), this is not yet possible, because there is no left neighbor. In the case of the second "0", the median of the three values "0, 0, 1" is also "0". For the subsequent value "1", the median of "0, 1, 0" must be formed. It is also "0". The fourth value is the median of "1, 0, 0", (i.e., "0" again). The corresponding signal sequence at the output will thus be 0, 0, 0, 0, 0. A spike will thus be eliminated.

(b) For a signal sequence at the input of 0, 0, 1, 1, 0, 0, the signal sequence at the output Will be 0, 0, 1, 1, 0, 0, such that the sequence remains unchanged. A square-wave pulse (step) will thus be transmitted unchanged.

(c) For a signal sequence at the input of 0, 0, 1, 2, 3, 4, the signal sequence at the output will be 0, 0, 1, 2, 3, 4. This sequence, which is a "ramp", will also be transmitted unchanged.

Median filters thus suppress noise spikes while preserving steps or steep edges of longer duration. Accordingly, the filter combines noise suppression with only slight smoothing of steep edges.

In the case of a median filter of degree 4 (N=4), the median of a group of five adjacent signals must be determined. The group consists of a signal, the two signals preceding this signal in time, and the two signals following this signal in time. It thus consists of a total of five signals $I_5, I_4, \ldots, I_1$. To compare each signal with every other signal and determine the median therefrom, the following comparisons are necessary:

| | |
|---|---|
| $I_1-I_2, I_2-I_3, I_3-I_4, I_4-I_5$ | 4 comparisons |
| $I_1-I_3, I_2-I_4, I_3-I_5$ | 3 comparisons |
| $I_1-I_4, I_2-I_5$ | 2 comparisons |
| $I_1-I_5$ | 1 comparison |
| Total: | 10 comparisons |

If it is found for any one of the five values $I_1$ to be compared that two of the remaining four values are less and two are greater, this value represents the median.

Figure 2A:
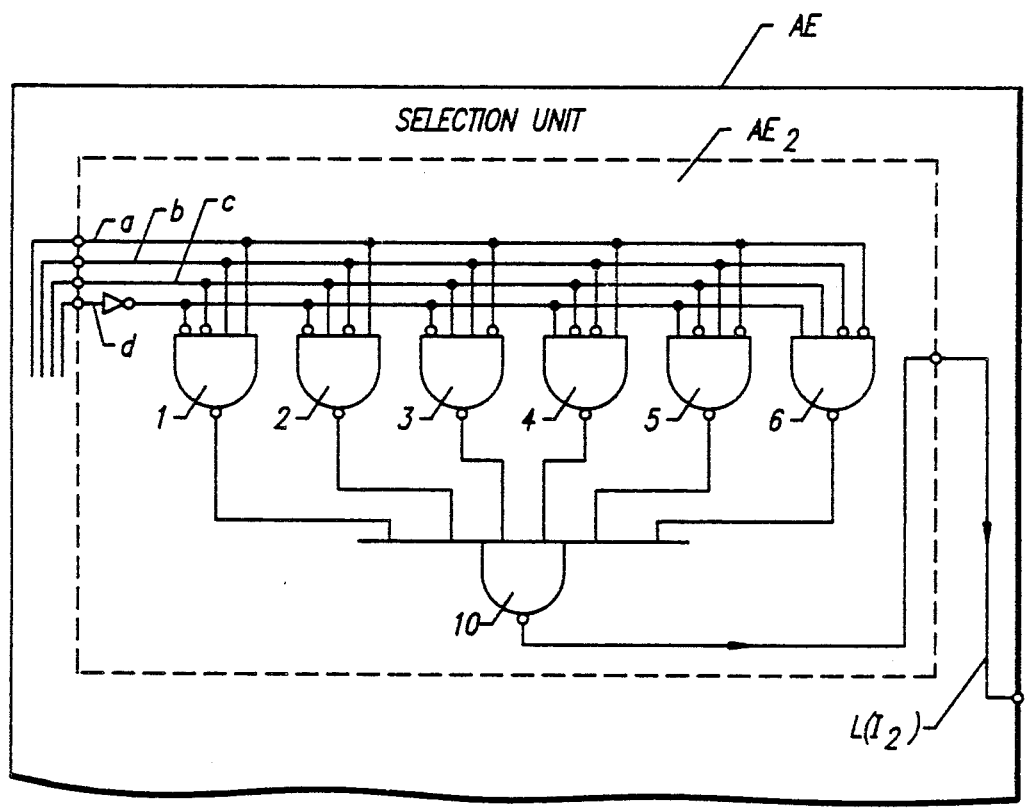
FIG. 2a illustrates the portion $AE_2$ of the selection unit AE of FIG. 1.
Figure 2:
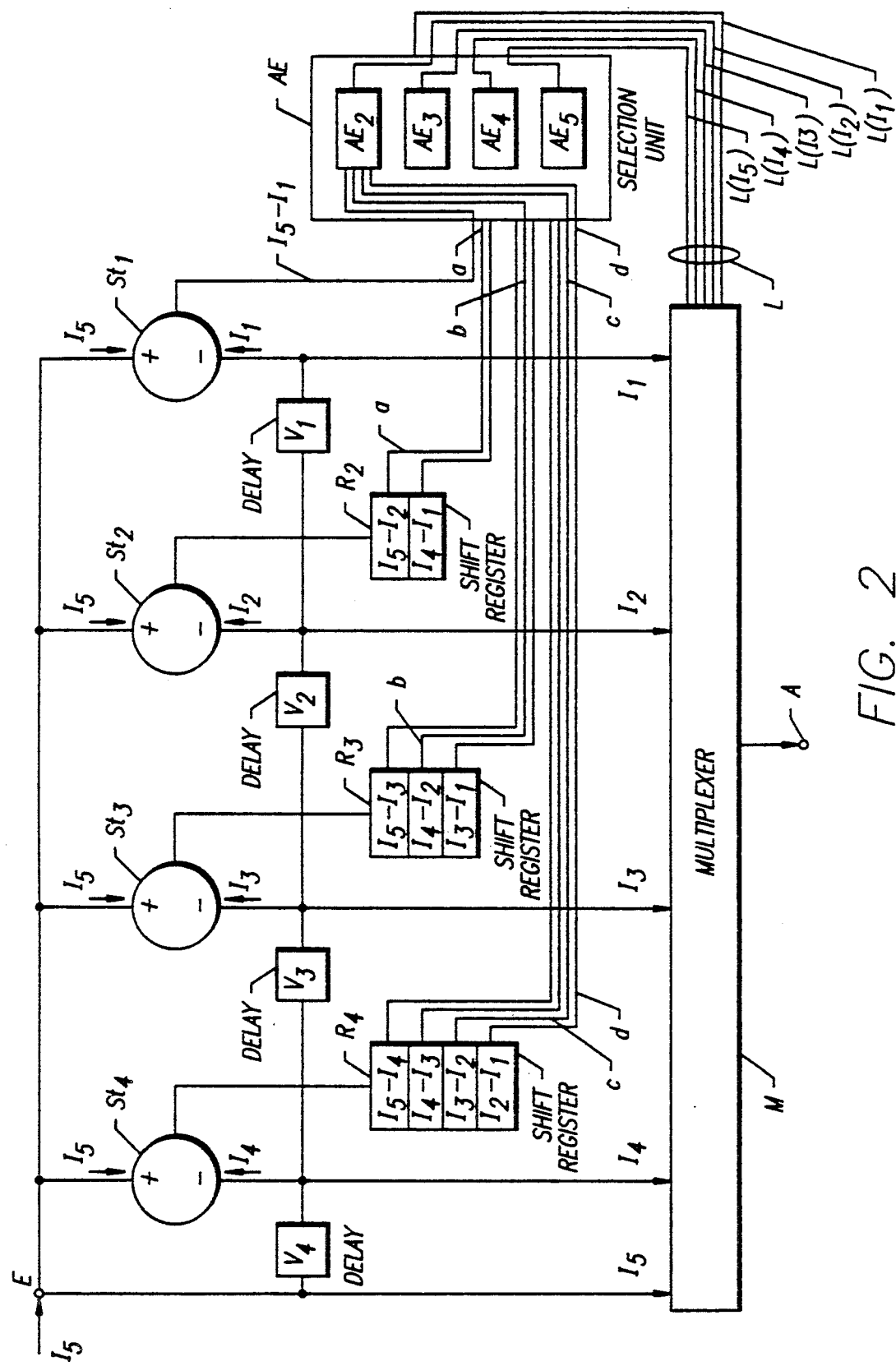
FIG. 2 illustrates an embodiment of the invention for a median filter of degree 4.

FIG. 2 shows an embodiment for N=4. The circuit will be considered at an instant at which the 5th signal $I_5$ appears at the input E (M bits in parallel). It is applied directly to the subtracters $St_4$, $St_3$, $St_2$, and $St_1$, namely to the respective minuend inputs (+). The respective subtrahend inputs (−) of these subtracters receive the signal from the input E via delay circuits $V_4$, $V_3$, $V_2$, and $V_1$, respectively, which provide a delay equal to the time interval between the corresponding pulse times of two consecutive signals $I_1$, (i.e., equal to the clock period). This means that the respective subtrahend inputs of the subtracters $St_4$, $St_3$, $St_2$, and $St_1$ are fed not with the signal $I_5$, but with the signal which was applied to the input E a corresponding number of clock periods earlier. Accordingly, $I_5$ and $I_4$ are applied for comparison to $St_4$, $I_5$ and $I_3$ are applied to $St_3$, $I_5$ and $I_2$ are applied to $St_2$, and $I_5$ and $I_4$ are applied to $St_1$. The subtracters perform the subtractions and transfer the signs of the results of the comparisons, which are sufficient for sorting (less than, greater than), over output lines to subsequent shift registers $R_4$, $R_3$, $R_2$. The contents of the shift registers are shifted by one memory location at the application of each clock pulse. Thus, at the instant at which $I_5$ is applied to the input E, the shift register $R_4$, which has four memory locations if N=4, contains the signs of the results of the following comparisons:

Memory Location 1: $I_5-I_4$;
Memory Location 2: $I_4-I_3$;
Memory Location 3: $I_3-I_2$;
Memory Location 4: $I_2-I_1$.

Similarly, the N−1=3 memory locations of the shift register $R_3$ contain the signs of the results of the following comparisons:

Memory Location 1: $I_5-I_3$;
Memory Location 2: $I_4-I_2$;
Memory Location 3: $I_3-I_1$.

The N−2=2 memory locations of the shift register $R_2$ contain the signs of the results of the comparisons $I_5-I_2$ and $I_4-I_1$.

The sign of the result of the comparison $I_5-I_1$ at the output of $St_1$ is processed directly, without a shift register. Here, none of the earlier comparisons is needed for the median of $I_5, \ldots, I_1$, so that no shift register is necessary.

Thus, by using four delay elements, connecting them in series, tapping them so that the signal $I_5$ applied to the input E of the circuit is delayed by 1, 2, 3 and 4 signal clock periods, respectively, and storing the results of the comparison in shift registers with 4, 3, and 2 memory locations, respectively, only four subtracters are needed. Nevertheless, the results of all ten subtractions necessary to determine the median are always available. This is based on recognition that during each signal clock period, subtractions are performed which were also performed during the preceding signal clock period. For example, at the instant of occurrence of $I_5$, the result of the subtraction $I_4-I_3$ is equal to the result of the subtraction $I-I_2$ in the preceding signal clock period, etc. These results are stored in the shift registers and shifted one place by each signal clock pulse, so that the number of subtractions required per signal clock period is reduced.

The results of these ten comparisons, which are available at four parallel outputs of the four memory locations of shift register $R_4$, three parallel outputs of shift register $R_3$, two parallel outputs of shift register $R_2$, and the output of $St_1$, are fed to a selection unit AE, which determines the median and delivers a signal to the multiplexer M over one of the five lines $L(I_1), \ldots, L(I_5)$ depending on the determination made. Depending on which of these lines has such an activating signal applied to it, one of the signals $I_5, I_4, I_3, I_2, I_1$, which are also applied to the multiplexer M direct, is switched to the output A.

To sort the signal values $I_5, \ldots, I_1$ and determine the median, only the signs of the differences are needed. It thus suffices to store only one sign bit in each memory location of the shift registers $R_4, R_3, R_2$.

The selection unit AE includes logic for determining from the signs of the results of the ten subtractions $(I_j - I_i)$ which of the signals $I_i$ is the one which is the median of the signal sequence $I_1, I_2, \ldots, I_5$. This can be implemented with a simple logic network or a PLA (programmable logic array) as follows:

The selection unit AE is divided into four subcircuits $AE_2, AE_3, AE_4$, and $AE_5$. These are assigned, respectively, to the signals $I_2, I_3, I_4$, and $I_5$ and to the corresponding lines $L(I_2), L(I_3), \ldots, L(I_5)$. A corresponding subcircuit for $I_1$ is not present in FIG. 2 although it must be present in principle. It is implemented with a simple circuit (not shown) which activates the line $L(I_1)$ whenever none of the other lines $L(I_2), \ldots, L(I_5)$ is activated. For the sake of clarity, only the lines a, b, c, d, which are connected to the subcircuit $AE_2$ within the selection unit AE, are shown in FIG. 2.

By way of example, the subcircuit $AE_2$ of the selection unit AE, which controls the activation of $I_2$ via line $L(I_2)$, will now be explained with the aid of FIG. 2a.

As is apparent from FIG. 2, those comparisons in which $I_2$ is involved appear on the lines a, b, c, d. If the signs of the results of two of these comparisons are negative ($I_2$ greater than the comparison partner), and the signs of the results of two further comparisons are positive ($I_2$ less than the comparison partner), then $I_2$ is the median. The corresponding circuit arrangement is shown in FIG. 2a. The signal on the line d is first inverted to obtain the sign of the result of the comparison $(I_1 - I_2)$ from the sign of the result of the comparison $(I_2 - I_1)$. Then, the conditions for the NAND function at each of the NAND gates 1, 2, 3, 4, 5, 6 are fulfilled if all four inputs are "1". Since two inputs are inverted, the conditions for the NAND functions are fulfilled at any one of the NAND gates 1–6 if two of the incoming lines are at "1" (result of the comparison positive) and the two inverted inputs are "0" (result of the comparison negative). The output of one of the NAND gates is then "0". If that is the case at any one of the NAND gates, the output of the NAND gate 10 is "1", so that the line $L(I_2)$ for activating $I_2$ is at "1".

The other subcircuits $AE_3, AE_4$, and $AE_5$ of the selection unit AE are constructed correspondingly In a simple case, the circuit AE may also be implemented with a simple ROM (read-only memory).

Figure 3:
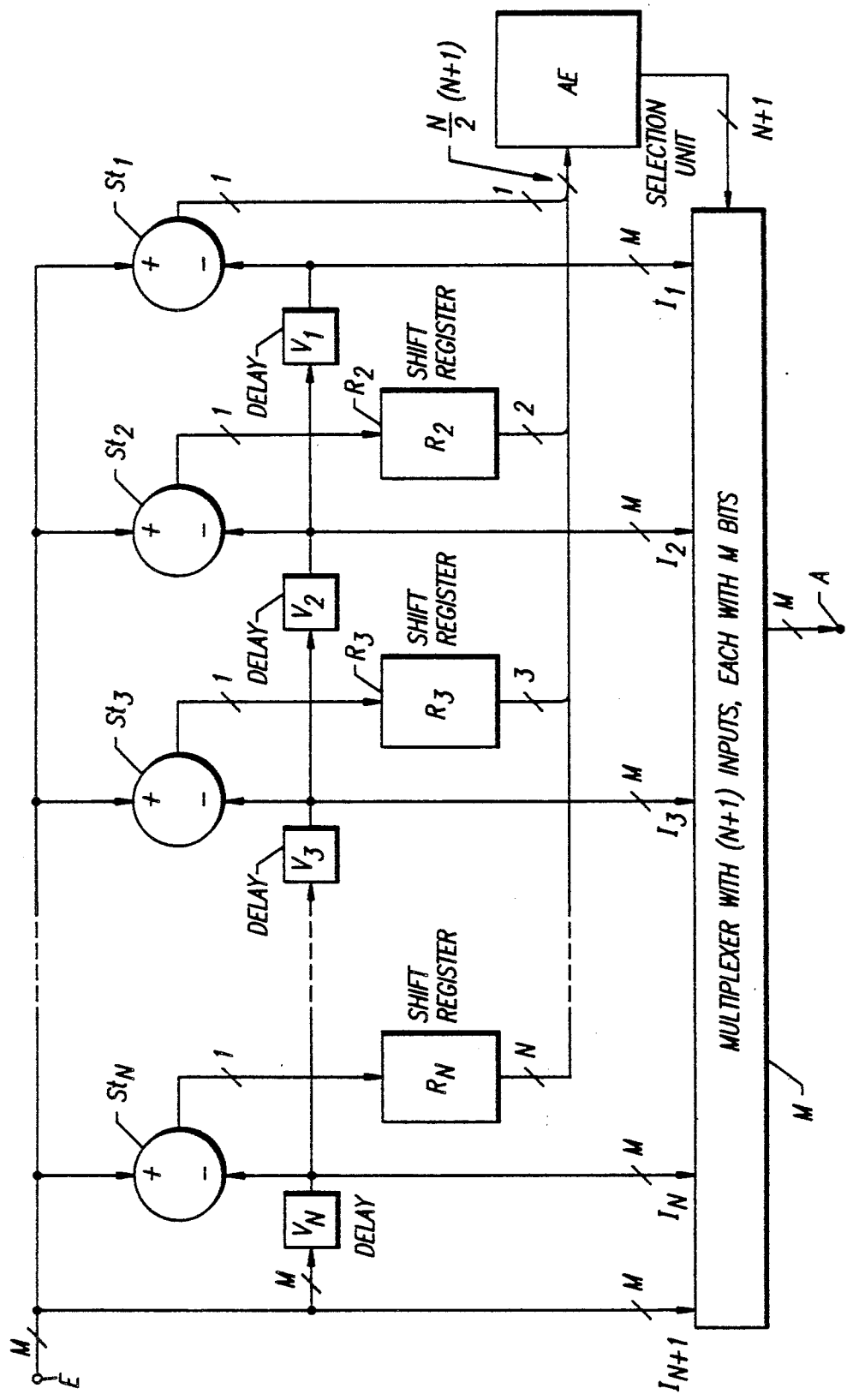
FIG. 3 is a generalized representation of the embodiment of FIG. 2.

FIG. 3 shows a generalization of the circuit of FIG. 2. N subtracters $St_N, \ldots, St_1$, N delay elements $V_N, \ldots, V_1$, and $N-1$ shift registers $R_N, \ldots, R_2$ are provided. Data is written into the shift registers serially, and the contents of each location of the shift register are read out in parallel. In FIG. 3, numbers or letters at short oblique strokes through the lines indicate how many parallel lines are present. The other designations are the same as in FIG. 2.

FIG. 4 shows an embodiment of a median filter of degree $N=4$ with serial processing. The system clock frequency $f_c$ is N times (i.e., 4 times in this embodiment) the sampling frequency $f_{sample}$ of the signals at the input E.

The signal clock periods are designated $S_1, S_2, \ldots, S_5$. They are the sampling periods of the signals received at the input, which are designated by $I_5$ at the instant of their occurrence at E. One signal clock period $S_1$ (frequency = $f_{sample}$) covers four system clock periods (frequency = $f_c$).

During the last system clock period belonging to $S_1$, the switch $S_a$ is in the lower position ("position 1l"). $S_1$ is applied to $V_4$. $V_4$ is one of four series-connected delay elements $V_4, \ldots, V_1$ (or V) which each introduce a delay equal to one system clock period.

The switch $S_a$ is now placed in its upper position (= position 2), i.e., the input of $V_4$ is connected to the output of $V_2$. After four system clock periods ($f_c$), $S_1$ is applied to the subtrahend input of the subtracter St. After these four system clock periods, however, $S_a$ has returned to the lower position for one system clock period. $S_2$ has already been present at E for three system clock periods. Thus, $S_2 - S_1$ is formed in St. After every four further system clock periods, $S_3 - S_2$, $S_4 - S_3$, $S_5 - S_4$ are formed in similar fashion.

While $S_a$ was in the upper position, i.e., during three of four system clock periods, the data circulated in the loop formed by $V_4, V_3$, and $V_2$, i.e., it was delayed there by 3 system clock periods ($N-1$). Thus, after the lapse of three system clock periods following the formation of $(S_2 - S_1)$, $S_1$ is again applied to St. At the other input of St, however, $S_2$ is already present, i.e., the other differences are formed analogously. The individual sequences of operations are illustrated in the table of FIG. 4a.

If the 5th signal clock period $S_5$ was present at the input for four system clock periods, all subtractions necessary for $N=4$ were performed, as is apparent from the differences correspond to the differences $I_j - I_i$ of the previous embodiments. The signs of these differences are transferred serially into the shift register R.

If the shift clock is locked to the system clock $f_c$ as shown in FIG. 4, $N(N+1)/2$ memory locations are necessary in the shift register R, for the entire data cycle for determining the respective median comprises the same number. The table of FIG. 4a shows a momentary condition for determining a median. The positions x are of no significance, but their respective states or sign values are important for the determination of one of the subsequent medians.

The selection unit AE and the multiplexer M of FIG. 4 operate in the same manner as those in FIGS. 2 and 3.

What is claimed is:

1. A median filter in which a signal in a signal sequence received at a filter input is replaced by a signal representing a middle value (median) in a signal group which is formed by the signal to be replaced as well as N/2 signals having occurred immediately before and N/2 signals occurring immediately thereafter, where N is an even integer and specifies the degree of the filter, wherein the signals in the signal sequence received at the filter input are fed to a cascade of delay elements having respective inputs and outputs, wherein the number of delay elements is equal to the degree of the median filter, so that upon receipt of a signal at the filter input, the N preceding signals appear at the outputs of the delay elements, and wherein the middle value of the signal group is determined in a selection unit and switched to the output of the median filter as a median signal, said median filter comprising:

N subtracters that receive the N signals appearing at the outputs of the delay elements which preceded the signal received at the input, said N subtracters forming differences between the signal at the input and the N preceding signals, said differences having arithmetic signs;

a plurality of shift registers that receive the signs of the differences, said shift registers shifting the signs of the differences by one place upon receipt of each new signal at the input so that said shift registers also hold the signs of the differences of the N preceding signals, each said shift register having a respective number of memory locations determined by the number of signs to be stored;

a selection unit that receives the signs of the differences from the memory locations of said shift registers, said selection unit determining from the signs of the differences a medina signal, said median signal being that signal for which N/2 differences have negative sigmas and N/2 differences have positive signs, said selection unit providing a corresponding control signal indicative of said median signal; and a multiplexer having an output and having a plurality of inputs that receive said signal received at said input and N preceding signals from the outputs of said delay elements and that receives said control signal from said selection unit, said multiplexer switching said median signal to said output.

2. A median filter as defined in claim 1, wherein said selection unit is divided into a plurality of subcircuits, each subcircuit comprising a logic network that determines for each of the input signals in the input sequence whether N/2 differences have positive signs and N/2 differences have negative signs, and that if this condition is satisfied for one of said input signals, a line assigned to said one signal is activated and is provided as said control signal to said multiplexer.

3. A method of processing signals in a median filter in which a signal in a signal sequence received at a filter input is replaced by a signal representing a middle value (median) in a signal group which is formed by the signal to be replaced as well as N/2 signals having occurred immediately before and N/2 signals occurring immediately thereafter, where N is an even integer and specifies the degree of the filter, wherein the signals received at said filter input are fed to a cascade of delay elements, each having an input and an output, and wherein the number of delay elements is equal to the degree of the median filter, so that upon receipt of a signal at said filter input, the N preceding signals appear at the outputs of the delay elements, and wherein the middle value of the signal group is determined in a selection unit and switched to an output of the median filter, said method comprising the steps of:

processing said signals at a system clock frequency having a system clock period, said system clock frequency being N times the sampling frequency at which the signals appear at the input of the median filter, said sampling frequency having a sampling period;

upon receipt of each signal at said filter input, connecting said signal to a cascade of N delay elements for the duration of one system clock period by means of a switch;

during the remaining system clock periods in each sampling period, connecting the input of the first delay element to the output of the next to the last delay element;

constantly connecting the output of the last delay element to a subtrahend input of a subtracter having a minuend input connected to the input of the median filter, such that during the N system clock periods after the receipt of a signal at the input, the subtracter forms differences between the signal at the filter input and the N preceding signals, said differences having respective arithmetic signs;

storing the signs of the differences in a shift register having N(N+1)/2 memory locations;

shifting said signs of the differences one place by each system clock pulse;

transferring the signs from the memory locations of the shift register to said selection unit;

selecting as the middle value that input signal for which N/2 differences have negative signs and N/2 differences have positive signs;

feeding a multiplexer with a signal currently being received at the filter input and with the N preceding signals from the outputs of the delay elements; and switching a selected one of said signals to the output of said multiplexer in dependence on the selection made in the selection unit.

4. A method of median filtering wherein a signal to be replaced in a signal group, comprising a sequence of signals beginning in time with $I_1$ and finishing with $I_{N+1}$, is replaced by a median signal representing a middle value in said signal group, said median signal being formed by said signal to be replaced as well as N/2 signals having occurred immediately before and N/2 signals occurring immediately thereafter, wherein N is an even integer and specifies the degree of filter, said method comprising the steps of:

receiving said sequence of signals comprising said signal group sequentially at an input of a median filter;

feeding said sequence of signals sequentially to a cascade of N delay elements having respective outputs, such that upon receipt of a final signal at said input, the N preceding signals in said sequence of signals appear at respective outputs of said cascade of delay elements;

feeding each one of said N signals appearing at said respective outputs to separate respective ones of N subtracters;

forming differences between said final signal and said N preceding signals, each difference having an associated arithmetic sign;

transferring said signs of said differences into respective shift registers, each shift register having a plurality of memory locations and each shift register respectively coupled to one of said subtracters;

shifting by one memory location said signs upon receipt of a new signal at said input such that said shift registers also hold certain preceding ones of the signs of said differences, the number of said memory locations of said registers being determined by the number of signs to be stored;

transferring said signs of said differences from said memory locations of said registers into a selection unit;

feeding into a multiplexer said new signal received at said input and said N preceding signals appearing at respective outputs of said cascade of delay elements;

determining said median signal in said selection unit from the signs of said differences transferred thereto, wherein said medina signal has the value of a certain signal in said signal group whereby N/2 of certain other signals in said group are greater than said certain signal while N/2 of yet other signals in said group are less than said certain signals; and providing a control signal from said selection unit to said multiplexer to switch said median signal to an output, the control signal varying in response to the determination made in said selection unit.

5. The method as defined in claim 4, wherein said selection unit comprises a plurality of subcircuits, each corresponding to a respective signal in said signal group, wherein each subcircuit comprises a logic network, and wherein the step of providing a control signal further comprises the steps of:

determining in each one of said subcircuits for each corresponding signal whether N/2 other of said signals in said group are greater than said corresponding signal while N/2 of yet other of said signals in said group are less than said corresponding signal; and activating a subcircuit output line if such determination is true, thereby providing said control signal.

6. A method of median filtering wherein a signal to be replaced in a signal group, comprising a sequence of signals beginning in time with $I_1$ and finishing with $I_{N+1}$, is replaced by a median signal representing a middle value in said signal group, said median signal being formed by said signal to be replaced as well as N/2 signals having occurred immediately before and N/2 signals occurring immediately thereafter, wherein N is an even integer and specifies the degree of filter, said method comprising the steps of:

receiving, at a sample frequency, said sequence of signals comprising said signal group sequentially at an input of a median filter;

upon receipt of each signal at said input, connecting said input to a cascade of N delay elements by means of a switch for the duration of one period of a system clock, said system clock having a frequency N times said sample frequency, said N delay elements having respective inputs and outputs, said N delay elements including a first delay element, a last delay element, and a next to the last delay element;

connecting the input of the first delay element to the output of the next to last delay element, by means of said switch for the duration of the following N−1 system clock periods;

continuously connecting the output of the last delay element to a subtrahend input of a subtracter, said subtracter having a minuend input coupled to said median filter input and having an output;

forming differences at the output of said subtracter during the N system clock periods after the receipt of each signal at said filer input, each difference having an arithmetic sign, said differences being between a signal presently received at said input and the N preceding signals received at said input;

storing the signs of said differences in a shift register having N(N+1)/2 memory locations;

shifting said signs stored in said register one place at the occurrence of each system clock pulse;

transferring said stored signs to a selection unit;

feeding into a multiplexer said signal presently received at said input and said N preceding signals appearing at respective outputs of said cascade of delay elements;

determining said median signal in said selection unit from the signs of said differences transferred thereto, wherein said median signal has the value of a certain signal in said signal group whereby N/2 of certain other signals in said group are greater than said certain signal while N/2 of yet other signals are less than said certain signal; and providing a control signal from said selection unit to said multiplexer to switch said median signal to a filter output, said control signal varying in response to the determination made in said selection unit.

* * * * *